United States Patent
Hahn et al.

(10) Patent No.: US 10,580,573 B2
(45) Date of Patent: Mar. 3, 2020

(54) PERSISTENT-MODE MRI MAGNET FABRICATED FROM REACTED, MONOFILAMENTARY MGB2 WIRES AND JOINTS

(71) Applicant: Massachusetts Institute of Technology, Cambridge, MA (US)

(72) Inventors: Seungyong Hahn, Tallahassee, FL (US); Yukikazu Iwasa, Weston, MA (US); Juan Bascunan, Burlington, MA (US); John Peter Voccio, West Newton, MA (US); Jiayin Ling, Cambridge, MA (US); Jungbin Song, Brookline, MA (US); YoungJae Kim, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 395 days.

(21) Appl. No.: 15/456,928

(22) Filed: Mar. 13, 2017

(65) Prior Publication Data

US 2017/0186535 A1   Jun. 29, 2017

Related U.S. Application Data

(62) Division of application No. 14/330,689, filed on Jul. 14, 2014, now Pat. No. 9,627,119.

(Continued)

(51) Int. Cl.
*H01F 41/04* (2006.01)
*G01R 33/3815* (2006.01)
(Continued)

(52) U.S. Cl.
CPC ....... *H01F 41/048* (2013.01); *G01R 33/3802* (2013.01); *G01R 33/3815* (2013.01);
(Continued)

(58) Field of Classification Search
CPC ............ H01F 6/00; H01R 4/00; G01R 33/381
(Continued)

(56) References Cited

U.S. PATENT DOCUMENTS 3,309,457 A   3/1967   Emery et al.
6,015,015 A * 1/2000   Luft .................... E21B 17/1007
                                                          166/241.6
(Continued)

OTHER PUBLICATIONS

Ling, et al; Monofilament MgB2 Wire for a Whole-Body MRI Magnet; Superconducting Joins and Test Coils. IEEE Transactions on Applied Superconductivity, vol. 23, No. 3, Jun. 2013.
(Continued)

*Primary Examiner* — Paul A Wartalowicz
(74) *Attorney, Agent, or Firm* — Peter A. Nieves; Sheehan Phinney Bass & Green PA

(57) ABSTRACT

A superconducting magnet and method for making a superconducting magnet are presented. The superconducting magnet is made by forming a coil from windings of a first wire comprising a reacted $MgB_2$ monofilament, filling a cavity of a stainless steel billet with a Mg+B powder. Monofilament ends of the first wire and a similar second wire are sheared at an acute angle and inserted into the billet. A copper plug configured to partially fill the billet cavity is inserted into the billet cavity. A portion of the billet adjacent to the plug and the wires is sealed with a ceramic paste.

17 Claims, 8 Drawing Sheets

Related U.S. Application Data

(60) Provisional application No. 61/846,067, filed on Jul. 14, 2013.

(51) Int. Cl.

| | | |
|---|---|---|
| *H01R 4/68* | (2006.01) | |
| *G01R 33/38* | (2006.01) | |
| *H01F 1/01* | (2006.01) | |
| *H01F 6/06* | (2006.01) | |

(52) U.S. Cl.
CPC ............... *H01F 1/01* (2013.01); *H01F 6/06* (2013.01); *H01R 4/68* (2013.01)

(58) Field of Classification Search
USPC ........................................................ 505/925
See application file for complete search history.

(56) References Cited

U.S. PATENT DOCUMENTS

| 8,420,558 | B2 | 4/2013 | Tenbrink et al. | |
|---|---|---|---|---|
| 2004/0009879 | A1 | 1/2004 | Giunchi et al. | |
| 2007/0171014 | A1 | 7/2007 | Iwasa et al. | |
| 2008/0167192 | A1 | 7/2008 | Kato et al. | |
| 2009/0258787 | A1 | 10/2009 | Wilkie et al. | |
| 2010/0190649 | A1 | 7/2010 | Doll et al. | |
| 2012/0135868 | A1* | 5/2012 | Huang | H01F 6/04 505/211 |
| 2012/0276362 | A1* | 11/2012 | Denavit | F16B 11/006 428/223 |
| 2013/0090245 | A1* | 4/2013 | Simpkins | H01R 4/68 505/231 |
| 2016/0086707 | A1 | 3/2016 | Hahn et al. | |

OTHER PUBLICATIONS

Iwasa; Update on Selected HTS Magnet Activities at FBML, Including a New Design Concept for Persistent-Mode HTS Shim Coils & A 1st-cut Design of a 100-T DC magnet. Jun. 26, 2013.
International Search Report for PCT/US2014/046526 dated Jan. 21, 2015.
Yukikazu Iwasa; Case Studies in Superconducting Magnets; Springer Science+Business Media, LLC 2009, pp. 408-410.

* cited by examiner

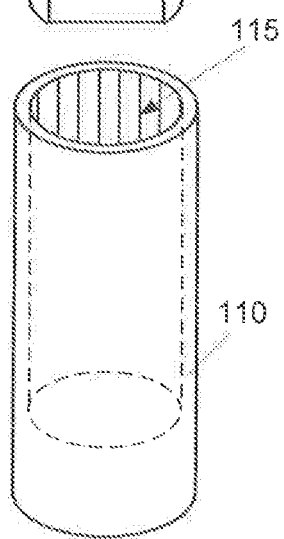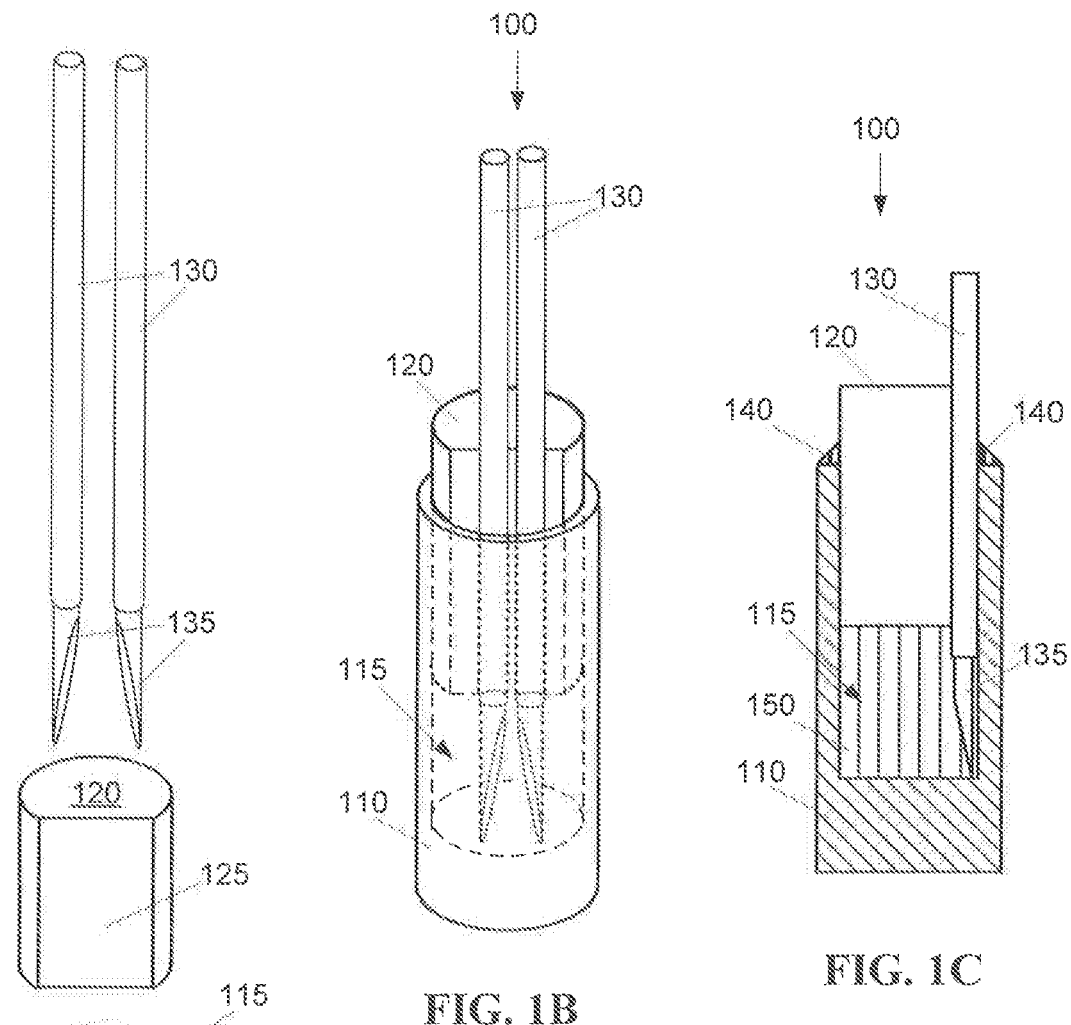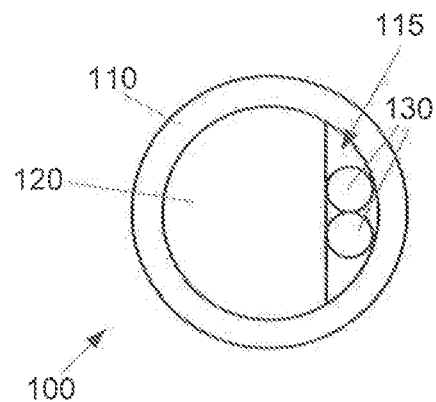
FIG. 1A  FIG. 1B  FIG. 1C  FIG. 1D

PERSISTENT-MODE MRI MAGNET FABRICATED FROM REACTED, MONOFILAMENTARY MGB2 WIRES AND JOINTS

CROSS-REFERENCE TO RELATED APPLICATION

This application is a divisional of and claims the benefit of U.S. patent application Ser. No. 14/330,689, filed Jul. 14, 2014, entitled "Persistent-Mode MRI Magnet Fabricated From Reacted, Monofilamentary MgB2 Wires And Joints," which claims the benefit of U.S. Provisional Patent Application Ser. No. 61/846,067, filed Jul. 14, 2013, entitled Persistent-mode MM magnet fabricated from reacted, monofilamentary MgB2 wires, both of which are incorporated by reference herein in its entirety.

GOVERNMENT LICENSE RIGHTS

This invention was made with government support under Grant No. EB002887 awarded by the National Institutes of Health. The government has certain rights in the invention.

FIELD OF THE INVENTION

The present invention relates to superconducting materials, and more particularly, is related to superconducting magnets.

BACKGROUND OF THE INVENTION

Magnetic resonance imaging (MRI) magnets are important for quality health care, for example, in early detection and efficient treatment of diseases or injuries. An MM magnet typically includes a coil of superconducting wire, a wire joint, and a persistent current switch (PCS).

PCSs are provided on many magnets to increase their temporal stability over long periods of time or to reduce the rate of helium boil-off associated with continually supplying current to the magnet using current leads. A PCS generally includes a short section of superconducting wire connected across the input terminals of a magnet and an integral heater used to drive the wire into the resistive, normal state. When the heater is turned on and the wire is resistive, a voltage is established across the terminals of the magnet and the magnet can be energized. Once energized, the heater may be turned off when the wire becomes superconducting and further changes in the magnet current cannot be made. In this persistent mode of operation, the external power supply can be turned off to reduce the heat input to the helium bath and the current will continue to circulate through the magnet and the PCS.

Existing MRI magnets are typically made from multifilament niobium-titanium (NbTi) wires. For these magnets, it is generally necessary to use multifilament superconducting wires to prevent an adverse condition known as flux-jumping, which makes it impossible to operate the magnet at full field. It is generally agreed, that monofilament NbTi wire is unsuitable for magnets because of flux jumping. Flux jumping depends on several characteristics of the wire and associated magnet. These characteristics include the filament diameter and also the operating temperature of the magnet. Existing magnets operate in liquid helium temperature (4K) and thereby require very small filaments, thus, the multifilament wires. As a result, these MRI magnets are very costly to buy and operate.

Most MRI magnets are operated in persistent mode. Therefore a superconducting joint technique is needed to splice MRI magnet wires to the MM magnet, for example, a 0.5 T whole-body MRI magnet. However, splicing of conventional NbTi monofilament wires to an MM magnet may result in reliability issues, for example, flux jumping as described above.

While it is fairly easy to make a persistent, superconducting joint between two unreacted ceramic wires, as ceramic powder reaches a semi-liquid state at the heat treatment at reasonably low temperatures, reacted wires are hard ceramics, making them much more difficult to join.

Reacted magnets can be made using a reacted, persistent wire joint; however, this approach is unattractive for two main reasons. First, in order to form the reacted joint, the entire magnet needs to be heat-treated in a furnace, or oven, after winding. Therefore, all of the magnet materials, including the wire insulation, winding mandrel, et cetera, need to be able to withstand high heat treatment temperatures of ~650 C. Second, if the unreacted wire joint does not work properly, there is no chance to re-make the joint, as the magnet wire is now reacted, thereby resulting in the whole magnet being unusable, making this an unacceptable risk for commercial manufacturing of MRI magnets. Therefore, there is a need in the industry to address at least some of the abovementioned shortcomings.

SUMMARY OF THE INVENTION

Embodiments of the present invention provide a persistent-mode Mill magnet fabricated from reacted, monofilamentary $MgB_2$ wires and joints. Briefly described, the present invention is directed to a method for making a superconducting magnet. The superconducting magnet is made by forming a coil from windings of a first wire comprising a reacted $MgB_2$ monofilament, filling a cavity of a stainless steel billet with an Mg+B powder. Monofilament ends of the first wire and a similar second wire are sheared at an acute angle and inserted into the billet. A copper plug configured to partially fill the billet cavity is inserted into the billet cavity. A portion of the billet adjacent to the plug and the wires are sealed with a ceramic paste.

Other systems, devices, methods and features of the present invention will be or become apparent to one having ordinary skill in the art upon examining the following drawings and detailed description. It is intended that all such additional systems, methods, and features be included in this description, be within the scope of the present invention and protected by the accompanying claims.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principals of the invention.

FIG. 1A is a schematic diagram of a wire joint under the first embodiment in an exploded view.

FIG. 1B is a schematic diagram of the wire joint under the first embodiment in an assembled perspective view.

FIG. 1C is a schematic diagram of the wire joint under the first embodiment from a side cutaway view.

FIG. 1D is a schematic diagram of the wire joint under the first embodiment from a top view.

DETAILED DESCRIPTION

Figure 2:
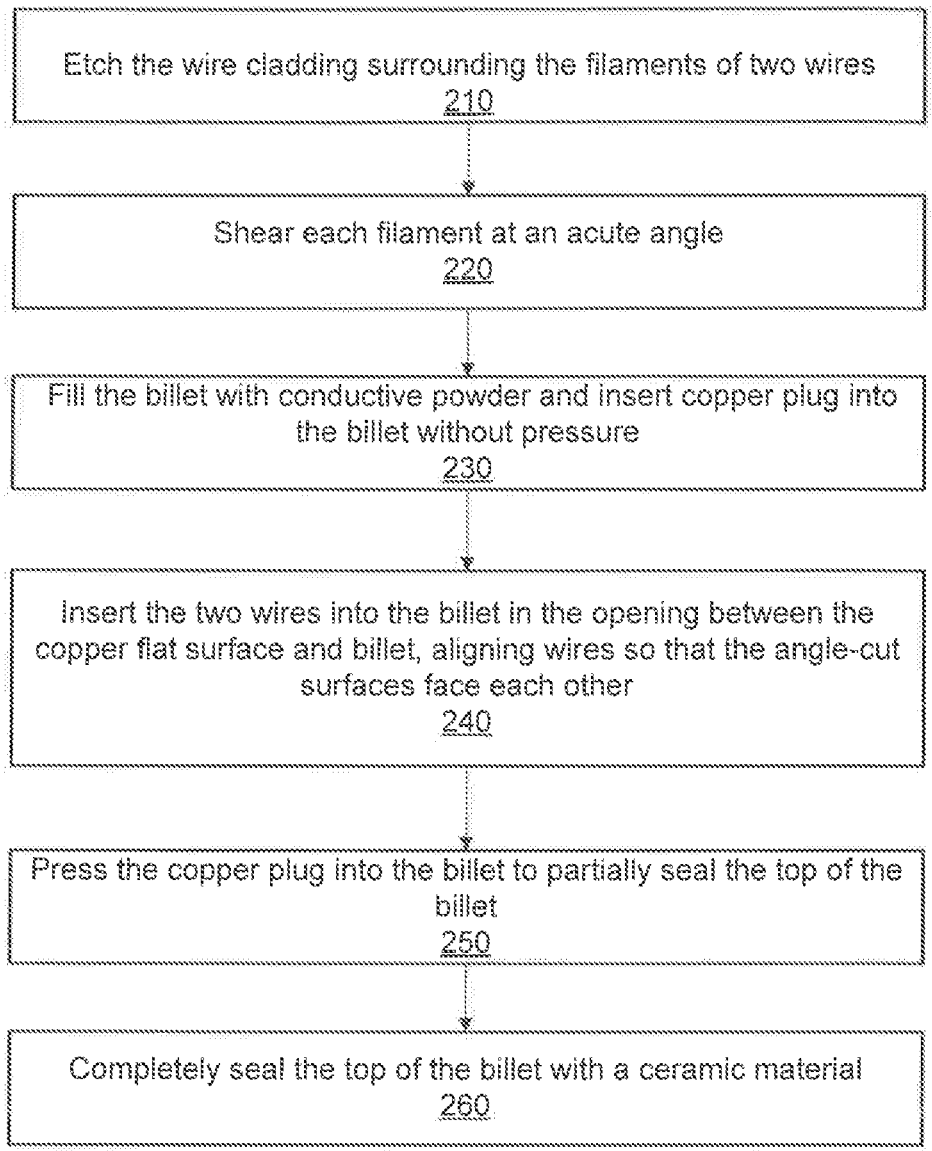
FIG. 2 is a flowchart showing an exemplary method for forming the wire joint of FIGS. 1A-1D.

Reference will now be made in detail to embodiments of the present invention, examples of which are illustrated in the accompanying drawings. Wherever possible, the same reference numbers are used in the drawings and the description to refer to the same or like parts. As used within this disclosure, "reacted" refers to a ceramic material that has been solidified, for example, by heating a ceramic powder.

As noted previously, prior art MRI magnets were generally formed of multifilament NbTi wire. As noted above, NbTi wire exhibits flux jumping behavior, necessitating multi-filament wires. Superconducting NbTi wires must be cooled by liquid helium. Further, previous methods of joining reacted monofilament wires were problematic, making MRI magnets using such wires unfeasible. Embodiments of the present invention include an MRI magnet made from reacted, monofilament reacted magnesium diboride ($MgB_2$) wires, including a persistent superconducting joint. The combination of this reacted joint with the monofilament $MgB_2$ magnet makes this novel technology valuable.

Under a first exemplary embodiment, a joint is formed by splicing two reacted $MgB_2$ monofilament superconducting wires. For example, such wires are manufactured by Hyper-Tech, consisting, from innermost to outermost, of an $MgB_2$ core of 0.4 mm in diameter, a layer of niobium, a layer of copper, and a layer of Monel. For example, an overall diameter of the wire may be 0.8 mm bare. In applying the splicing technique (described below), the joining may occur at a sintering temperature of 700° C. for 90 minutes, a combination of temperature and duration required to react the winding itself. This is important because an MM magnet of the second embodiment (described below) applies a wind-and-react procedure. The MRI magnet is wound with $MgB_2$ in a fashion similar to winding with NbTi wire, as is familiar to persons having ordinary skill in the art, so this disclosure instead discusses the differences involved in using $MgB_2$ wire for an MRI magnet, and in particular, an $MgB_2$ wire joint.

FIG. 2 is a flowchart showing a modified joining fabrication process of a joint 100 between two reacted $MgB_2$ wires 130 is shown in FIGS. 1A-1D. It should be noted that any process descriptions or blocks in flowcharts should be understood as representing modules, segments, portions of code, or steps that include one or more instructions for implementing specific logical functions in the process, and alternative implementations are included within the scope of the present invention in which functions may be executed out of order from that shown or discussed, including substantially concurrently or in reverse order, depending on the functionality involved, as would be understood by those reasonably skilled in the art of the present invention.

As shown by block 210 a cladding of the wires 130 surrounding the monofilaments 135, for example, copper and Monel cladding, is etched, for example, with nitric acid. The filaments 135 may be preferably sheared at an acute angle for each wire 130, as shown by block 220. For example, the filaments 135 may be sheared at an angle of 45 degrees or less with respect to a center axis of the wire. A more acute angle provides a larger splicing surface, better enabling conduction through the joint. In general, the more acute the wire cutting angle, the better, although a joint 100 may function correctly even if the wires 130 are cut at a 90 degree angle with respect to a center axis of the wire 130. Ideally, a cut could be made nearly parallel to the axis of the wire (splitting the wire in half), although this may not be practical with a shear.

A billet 110, is formed from a material able to withstand and/or exert appropriate pressure on the contents of a cavity 115 within the billet 110. For example, the billet 110 may be formed of stainless steel. Other materials for the billet 110 may be used, provided the materials have a melting point greater than a heat treatment temperature of 700 Celsius, and a Young's modulus of greater than 60 MPa. The cavity 115 is filled with a ceramic powder 150, for example, pre-mixed Mg+B powder having a 1:2 ration of Mg to B. However, other ratios are possible, for example, a more magnesium-rich ratio of Mg:B>1:2. In general, a ratio of at least 1 part Mg to 2 parts B is acceptable, as the magnesium vaporizes.

A plug 120, for example, a copper plug, is inserted into the billet cavity 115 without applying pressure to the ceramic powder 150, as shown by block 230. Other materials for the plug 120 may be used, provided the materials have a melting point greater than a heat treatment temperature of 700 Celsius, and a Young's modulus of greater than 60 MPa. The two wires 130 are inserted into the billet cavity 115 in an opening between a flat surface 125 of the plug 120 and the billet 110, aligning the wires 130 so that the angle-cut surfaces of the filaments 135 face each other within the cavity 115, as shown by block 240. The plug 120 is pressed into the billet cavity 115 to partially seal the top of the billet 110, as shown by block 250.

Pressure is applied to the top of the plug 120 downward into the billet cavity 115 in a direction parallel to a center axis of the wires 130, so that the pressure is less likely to damage the sheared monofilaments 135 than pressure applied in a direction traversing the center axis of the wires 130. For example, pressure levels on the order of 1 GPa (higher than the yield strength of stainless steel) may be applied to press the plug 110 into the billet cavity 115. If other high density ceramics or unreacted wires are used, higher pressures may be used, for example, stresses in the 2-5 GPa range, which may need additional tooling to keep the billet in isostatic compression, so that no deformation occurs. If excessive pressure is used, the billet 120 or the plug 110 may be damaged. If insufficient pressure is applied, the joint 100 may not function correctly. The top of the billet 110 is sealed, for example, using ceramic paste 140, completely sealing the top of the billet cavity 115, as shown by block 260.

The three main benefits to this new process are that: (1) the relatively fragile sheared filaments 135 are aligned with the pressing direction of the plug 120, reducing the possibility of breaking the filaments 135, (2) the acute angle cut of the filaments 135 maximizes the joint surface area, resulting in higher joint critical currents and better reproducibility, and (3) this method implements simpler parts and minimizes handling and assembly time when compared with the prior art.

Compared with the prior art, key differences in forming a reacted joint 100 under the first embodiment may include one or more of: (1) higher powder compaction pressure; (2) a billet able to enable these higher packing pressures; (3) a change in the tooling required to apply these high pressures; and (4) changes in the heat treatment profile, including time and/or temperature. For example, while heat treatment should exceed the melting temperature of magnesium (650 C), otherwise there is no upper bound to either the time or temperature for the heat treatment profile.

In alternative embodiments, the copper steel (or stainless steel) plug 120 may incorporate a center hole through which the wires 130 are inserted. A compacting rod used to press the plug 120 into the billet cavity 115 may similarly have a center hole to accommodate the ends of the wires 130. The compacting rod may accommodate a tight fit to the outside of the billet 110. In this manner, force may be applied symmetrically down the center axis of the billet 110, preventing any bending which could snap the wires 130. Such a compacting rod may provide compressing the billet 110 to higher loads upwards of 10,000 lbs. in order to exceed 1 GPa powder packing pressure. At these high pressures, it may be difficult to extract the billet 110 from the compacting rod. Other compressing means are also possible, for example, but not limited to including a two part mold for this process.

As noted previously, while joints for unreacted wire are relatively simple, constructing an MRI magnet from unreacted wire is problematic, as each of the components of the magnet would have to be subject to the heating of the reacting process. Therefore, the former or bobbin of a magnet coil would need to be made of a material to withstand this heat. In contrast, a reacted wire magnet may be wound on a non-metallic, lightweight former, such as G-10 or "Garolite," or similar composites, which are commonly used in MRI magnets today.

Figure 3:
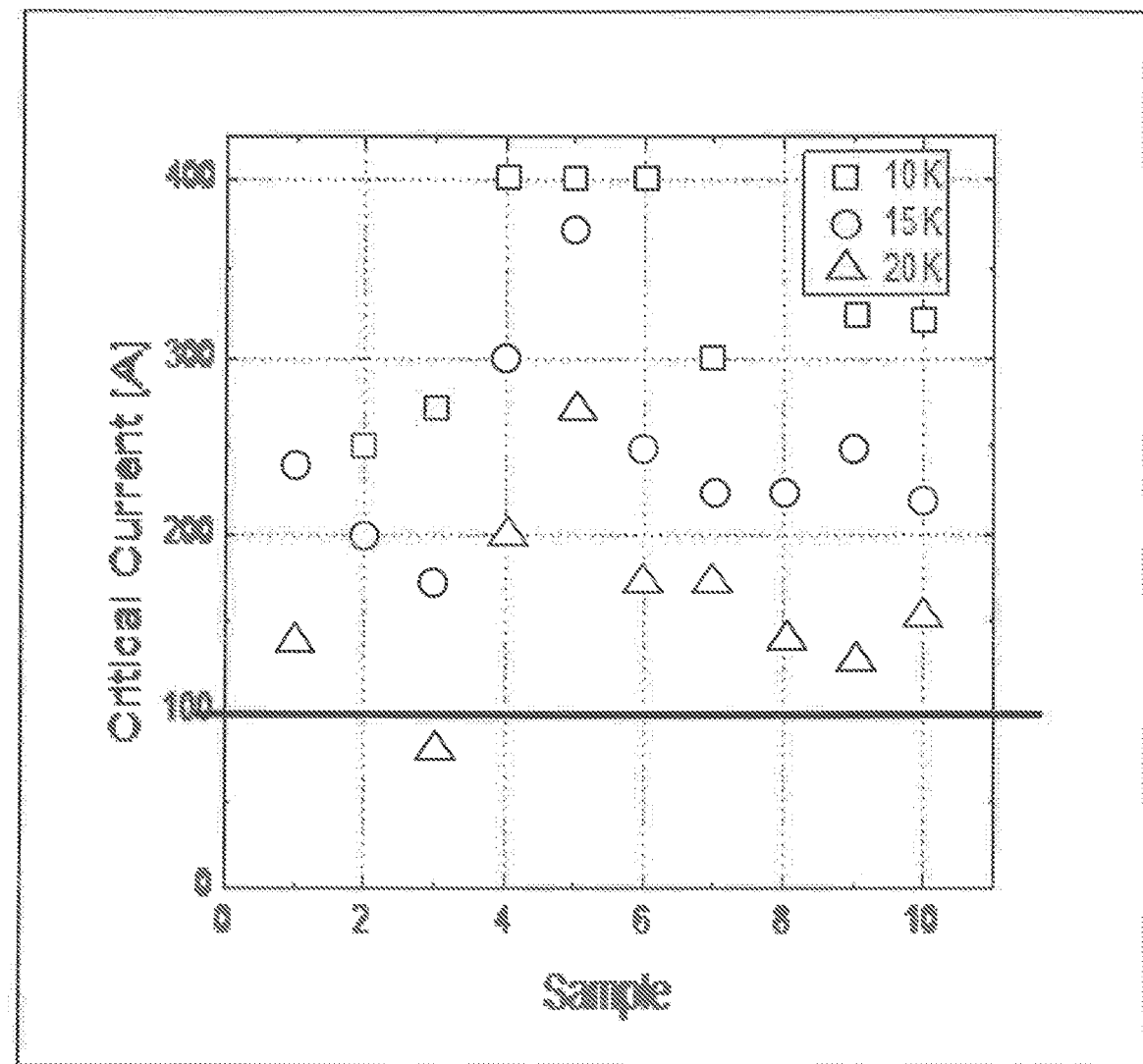
FIG. 3 is a chart summarizing critical currents under the first embodiment, measured at 10 K, 15 K, and 20 K in self-field, of 12 angle-cut $MgB_2$ joints.

FIG. 3 shows a summary of superconducting joint results of ten sample monofilament $MgB_2$ wires, measured at 10 K, 15 K, and 20 K in self-field, of 12 angle-cut $MgB_2$ joints. Most samples had critical currents higher than 100 A, even at 20 K. 400 A was the limit of the power supply. Critical currents were measured by the four-probe method familiar to persons having ordinary skill in the art. Since the $MgB_2$ filament is surrounded by niobium, the only part exposed to the Mg+B mixture ingot in a joint 100 (FIG. 1B) is an end tip of the wire filament 135 (FIG. 1B) of small contact area. Therefore, in the first embodiment, each filament 135 (FIG. 1B) is cut at an acute angle to enlarge this contact area significantly. FIG. 3 data shows that all the joints have acceptable (>100 A) critical currents. The best joints have critical currents well above 100 A, e.g., sample #5 with 270 A even at 20 K, which will suffice for use in a 0.5 T whole-body MII magnet operating nominally at 10-15 K.

Figure 4:
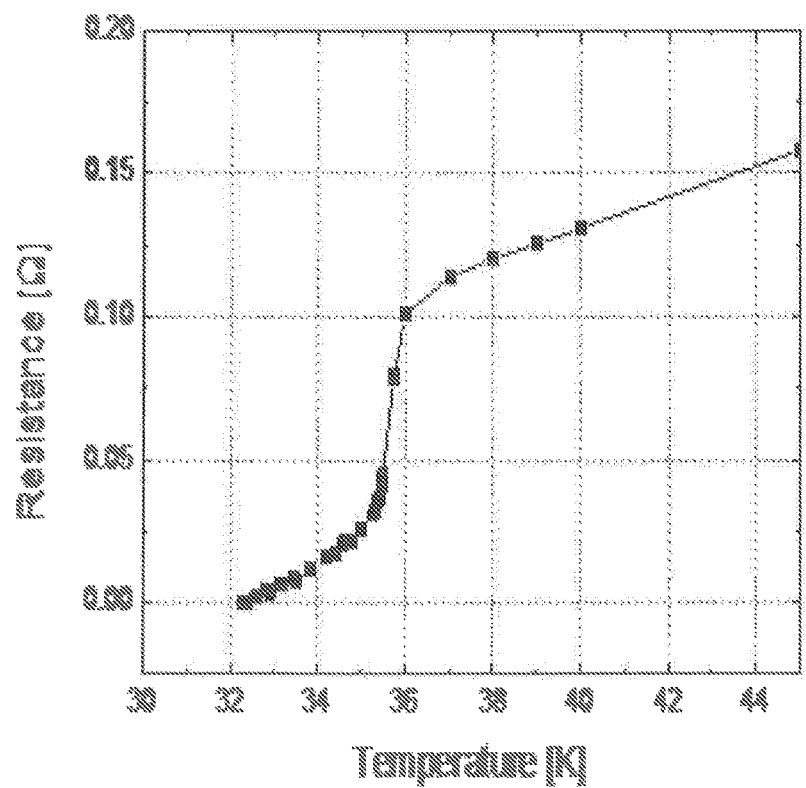
FIG. 4 is a plot of resistance vs. temperature profile of an $MgB_2$ joint of FIG. 3.

FIG. 4 is a plot of a resistance vs. temperature profile of one of the $MgB_2$ joints of FIG. 3. The critical temperature was determined by measuring the joint resistance during cool-down. The data are plotted in FIG. 4, showing the onset of the superconducting transition at about 36 K. However, the whole joint is not superconducting above about 32 K. This rather broad transition observed in the joint 100 (FIG. 1B) may be due to a slight difference in composition of powders used in the two wires and in the ingot. The steeper section may represent the transition of wire, while the gradual section may represent the transition of the ingot in the joint.

With a successful splicing technique for monofilament $MgB_2$ wire, an MII magnet with monofilament $MgB_2$ wire becomes feasible. Note that it is generally agreed, because of flux jumping, that monofilament NbTi wire is unsuitable for magnets. However, theoretically flux jumping is unlikely to happen in $MgB_2$ wire at 15 K, even if the monofilament is 0.4 mm in diameter. The absence of flux jumping in such monofilament $MgB_2$ wire was verified by a series of experiments with short $MgB_2$ samples and $MgB_2$ test coils, described below.

Short samples of $MgB_2$ were cut from the same spool used to make test joints. The joints were heat treated in the same temperature vs. time profile used for the joints and the test coils, i.e., a temperature of 700° C. for 90 minutes. A bundle of 12 reacted samples was inserted into the cold bore (6.4 mm in diameter) of a miniature NbTi magnet. With the NbTi magnet sweeping at a constant rate of 0.5 T/s, the sample magnetization was measured using a small search coil. Besides $MgB_2$, a bundle of monofilament NbTi short samples, of the similar filament (0.4 mm) and overall size, was also tested as a reference. Since NbTi magnet was employed as the background magnet, these tests were performed at 4.2 K only.

Figure 5:
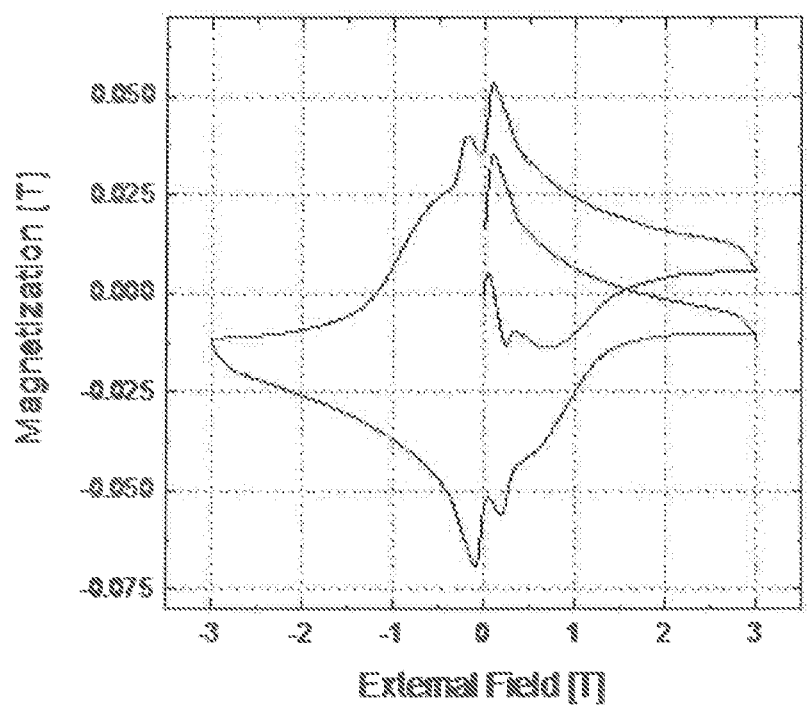
FIG. 5 is a graph plotting magnetization vs. field trace of a bundle of 12 short samples of monofilament $MgB_2$.

FIG. 5 shows a magnetization vs. field trace of the monofilament $MgB_2$ bundle. The trace is generally smooth, except the zero-field dips in magnetization: each small dip is likely caused by a partial flux jump.

Figure 6:
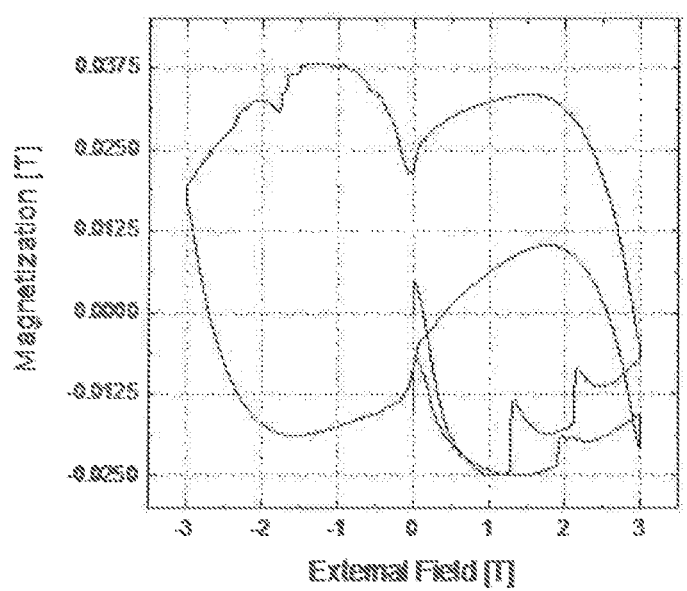
FIG. 6 is a graph plotting magnetization vs. field trace of a bundle of short samples of prior art monofilament NbTi.

FIG. 6 shows a magnetization vs. field trace of the monofilament NbTi bundle. Four in-field dips in magnetization trace indicate partial flux jumps. The zero-field dips are also more pronounced than those of the monofilament $MgB_2$ bundle.

In order to further demonstrate that the absence of full flux jumping observed in short monofilament $MgB_2$ wires still holds in coils, a test coil was built, wound with 100-m long of the same monofilament $MgB_2$ wire. The wire, S-glass insulated, has an overall diameter of 1 mm.

Figure 7:
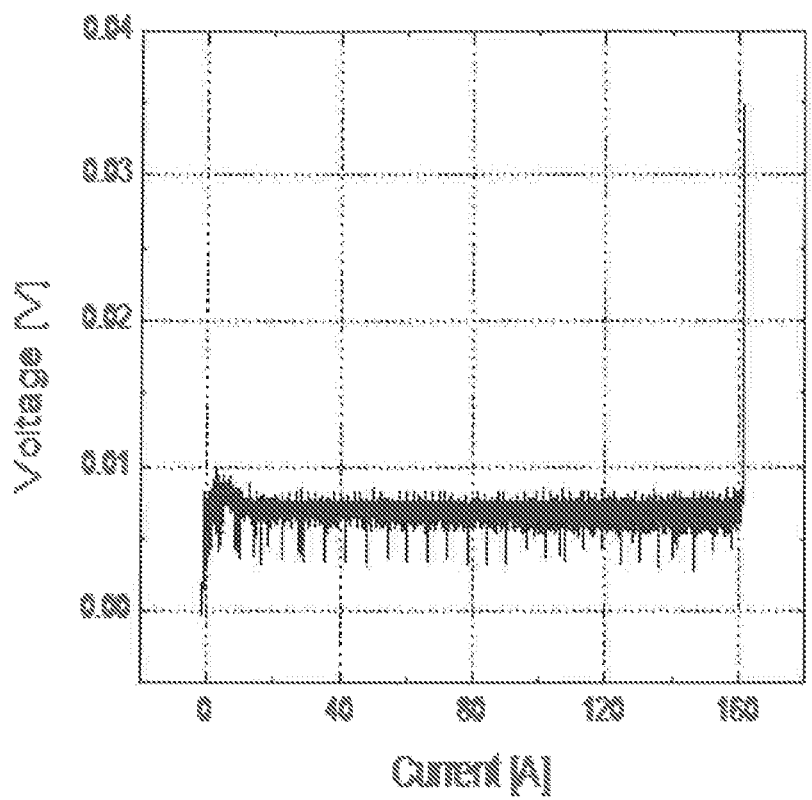
FIG. 7 is a graph plotting voltage vs. current curve of the $MgB_2$ test coil measured at 15 K and in self-field at a ramping rate of 1 A/s.

The coil, at 15 K and in self-field, was first charged at a ramping rate of 1 A/s until it quenched at 160 A, which was its critical current predicted by short sample tests. A measured voltage vs. current curve is shown in FIG. 7, displaying many voltage spikes. Each voltage spike may be caused by a flux jump or a mechanical disturbance incident, as the test coil was not epoxy-impregnated, a standard procedure in NbTi magnets to minimize the mechanical disturbances. As expected, none of these voltage spike incidents quenched the test coil.

Figure 8:
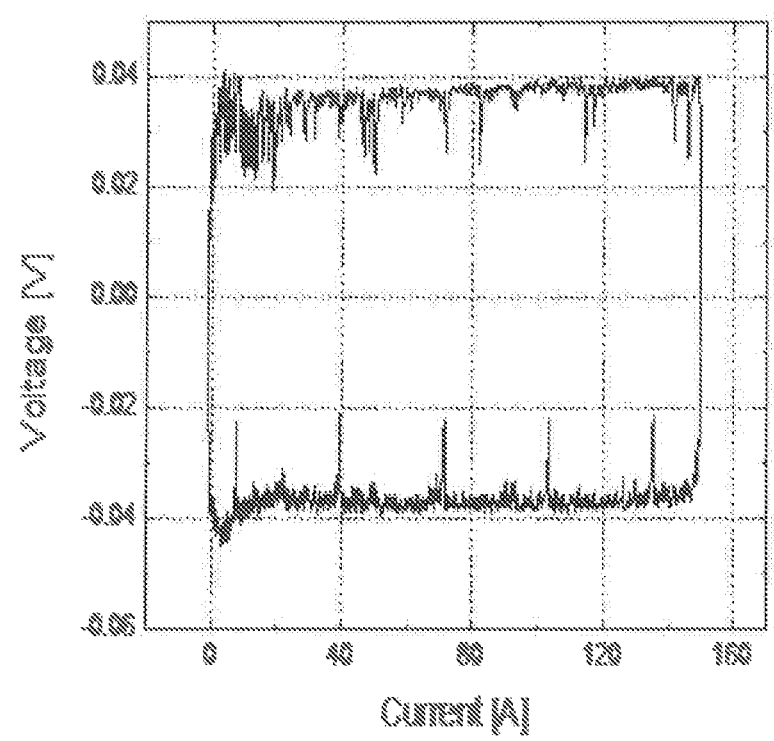
FIG. 8 is a graph plotting voltage vs. current curve of the $MgB_2$ test coil measured at 15 K and in self-field at a ramping rate of 5 A/s.

To further test the coil stability, the coil was charged at a higher ramping rate of 5 A/s. As shown by FIG. 8, the spikes are obviously stronger. But, still, they did not quench the coil even at 90% of the coil's critical current. The procedure was repeated several times, and every time the coil was charged up to 90% of its critical current without quench. Therefore this monofilament $MgB_2$ coil, despite evidences of either flux motion, mechanical disturbance, or both, was operated absolutely quench free.

Figure 9:
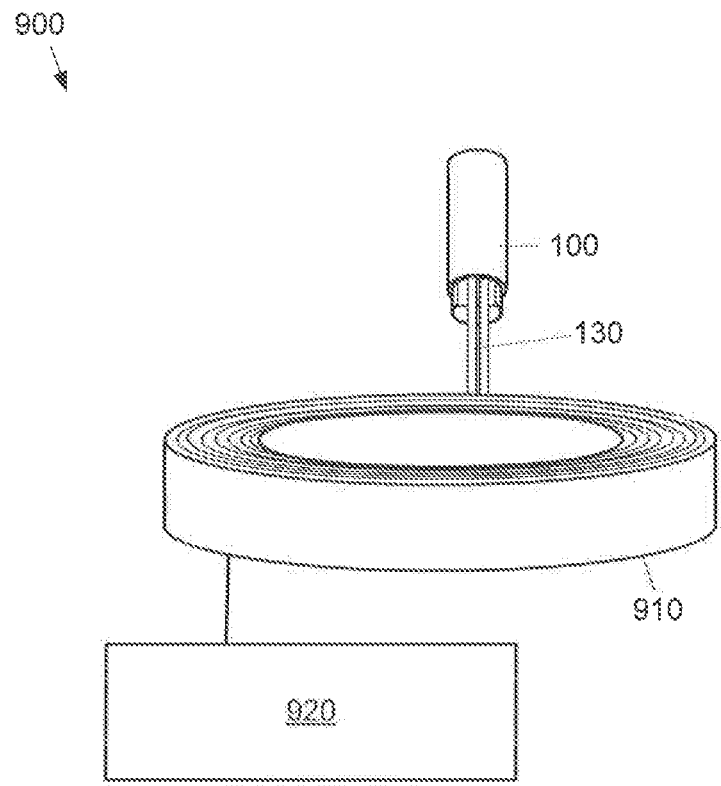
FIG. 9 is schematic diagram of an MM magnet under a second exemplary embodiment.

A second embodiment of the present invention is an MRI magnet 900 formed with a persistent-mode monofilament $MgB_2$ coil 910, as shown by FIG. 9. After the monofilament $MgB_2$ test coil was operated quench free, the persistent-mode monofilament $MgB_2$ coil 910 was designed, fabricated, and tested. The coil 910 may be formed by winding multiple windings of reacted $MgB_2$ wires 130. The coil 910 may be equipped with a PCS 920 and terminated by a superconducting joint 100, for example, as described above under the first embodiment. The coil 910 may be wound, for example, with 50-m long monofilament $MgB_2$ wire, as per the tests described above. The wire 130 may be insulated by S-glass. The calculated center field may be, for example, 0.84 T at 100 A current, at which the maximum field in the winding is 0.94 T. The joint 100 may be placed at the upper edge of the coil, in which the maximum field is 0.35 T at 100 A. The PCS may contain the same wire of 1 m long, having 2 mΩ open resistance.

After the coil was wound and heat treated, it was placed in a copper can (not shown), which is housed in an aluminum chamber (not shown). The can provided an isothermal environment for the coil. A heater (not shown) was wound around the can to heat it up above 4.2 K during the tests. The copper can was then placed in the aluminum chamber. The space in between the two enclosures was filled with Styrofoam. The aluminum chamber was immersed in liquid helium during tests, with the heater controlling the temperature of copper can in the range of 4.2 K-15 K.

In the beginning of the test, the PCS 920 was opened, and the coil at 10 K was charged by an external power supply at 0.5 A/s up to 100 A. Since the time constant of the coil 910 is calculated to be 2 s, a few seconds at 100 A elapsed before closing the PCS, and the external power supply was then brought to zero.

During charging sequence the field at the center of the coil 910 increased linearly with current. The charging behavior indicates that 2-mΩ open-resistance of the PCS 920 is large enough for this 3.2-mH coil, allowing only negligible current through the PCS 920. A measured field of 0.83 T at the center matched the calculation, with calculated fields of 0.94 T (maximum in the winding) and 0.35 T (at joint site). The coil 920 was warmed up from 10 K to 15 K at ~0.2 K/min and kept at 15 K over a period of ~2500 s. Limited by measurement resolution, one can only determine a relative field decay of less than 10-4 over a test period of ~2500 s. This means that the time constant is longer than $2.5 \times 10^7$ s, with a computed total circuit resistance of less than $1.3 \times 10^{10}$ Ω.

$MgB_2$ has a critical temperature of 39 K, enabling $MgB_2$ magnets under the second embodiment to operate above 4.2 K, the nominal temperature of most NbTi MRI magnets. Operation above 4.2 K may reduce the complexity and cost of MRI units. The simple chemical composition of $MgB_2$ makes the manufacturing of km-long wires possible.

$MgB_2$ magnets under the second embodiment may be operated above 10 K, at which temperature the filament diameter can be on the order of ~1 mm without causing flux-jumping. It has been demonstrated that $MgB_2$ wires with 0.8 mm diameter (and 0.4 mm internal filament diameter) can indeed be made without flux jumping. The present invention is not limited to such measurements. Furthermore, it is significantly easier to make a superconducting joint between two monofilament wires, as opposed to joining multifilament wires.

Figure 10:
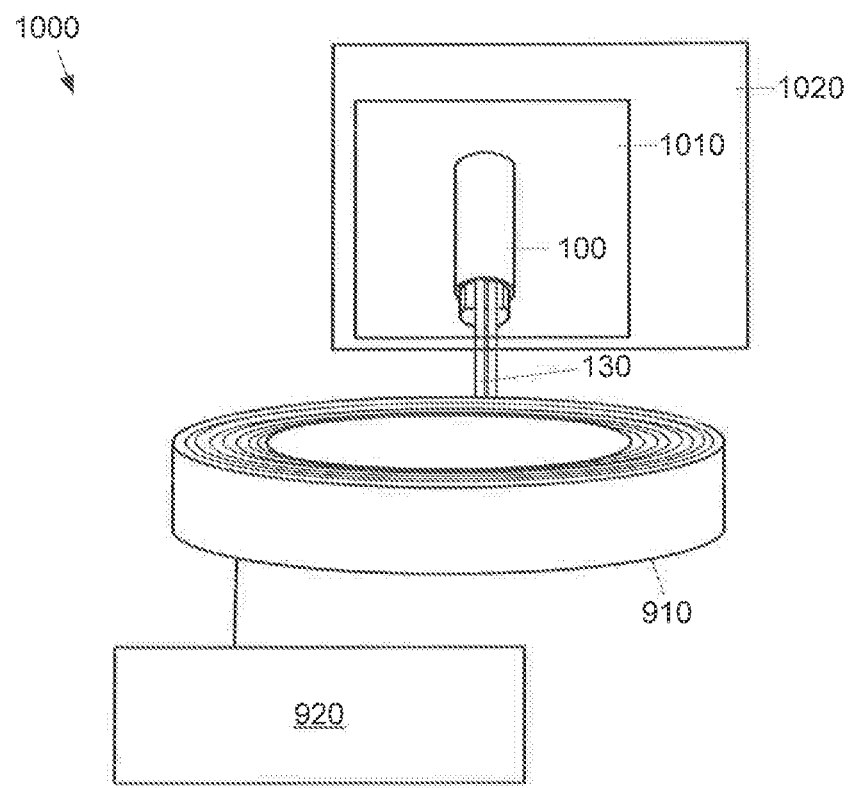
FIG. 10 is schematic diagram of an MM magnet system under an alternative exemplary embodiment.

In an alternative embodiment, shown in FIG. 10, one or more superconducting joints 100 in a magnet system 1000 may be located in a joint box 1010. The joint box 1010 may be used to heat or cool the joint(s) 100, as may be needed for a particular magnet system 1000. For example, the joints 100 may all be heat treated simultaneously in a localized furnace 1020 which surrounds the joint box 1010. Additionally, the joint box 1010 may be cooled to a lower temperature (minimum value of 1.8 K, corresponding to superfluid helium) than a temperature of the main magnet 910 in order to improve performance of the joint(s) 100. In this manner, it is possible to use the superconducting properties of the niobium coating on the MgB2 filament to achieve the joint 100 superconductivity. For example, the superconducting path may be from one reacted MgB2 filament, thru the niobium barrier, thru the reacted powder in the joint billet, thru the second niobium barrier and into the second MgB2 filament. The main magnet 910 may still operate at 10 K, while the joint box 1010 operates at the lower temperature.

In summary, the combination of the monofilament wire and the novel joint-making process makes it not only possible, but also practical, to make a persistent $MgB_2$ joint. For example, a MM magnet manufacturer could purchase insulated superconducting $MgB_2$ wire from the wire manufacturer then simply wind the magnet and make the joint. Therefore, the magnet manufacturer would not be responsible for the performance of the wire, in contrast with prior art magnets, where the magnet manufacturer was responsible for the proper heat treatment of the wire in magnet form and needed to accept the risk of improper heat treatment. Embodiments of the present invention therefore have the potential to replace some, if not all, of the world's existing MM magnets, given the looming helium crisis. The technology may open up new markets in countries where that do not even have access to liquid helium.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for joining monofilament superconducting wires, comprising the steps of:
    filling a cavity of a billet having a single cavity opening with a ceramic powder;
    for each of a first wire and a second wire comprising a reacted ceramic monofiliment:
        shearing an end of the monofilament; and
        inserting the wire into the billet cavity;
    inserting a plug configured to partially fill the billet cavity into the billet cavity; and
    forming a partial seal of a portion of the billet cavity adjacent to the plug and the wires with a sealing material,
    wherein the first wire end monofiliment and the second wire end monofiliment are disposed within the billet cavity, the first wire and second wire extending outward from the single billet cavity opening via a gap of the partial seal between the billet and the plug.

2. The method of claim 1, further comprising the step of pressing the plug into the billet to pressurize the ceramic powder.

3. The method of claim 2, wherein the pressing is in a direction aligned with the first wire and the second wire within the cavity.

4. The method of claim 1, wherein the first and second wire each comprises a reacted $MgB_2$ monofilament.

5. The method of claim 1, wherein the wire is sheared at an acute angle with respect to a center axis of the wire.

6. The method of claim 1, wherein the ceramic powder comprises Mg+B.

7. The method of claim 1, wherein the billet comprises stainless steel.

8. The method of claim 1, wherein the plug comprises copper.

9. The method of claim 1, further comprising the step of etching a portion of a wire cladding surrounding the end of the monofilament.

10. The method of claim 1, wherein the sealing material comprises a ceramic paste.

11. A superconducting magnet, comprising:
a first wire comprising a reacted $MgB_2$ monofilament;
a bobbin;
a coil formed of the first wire wound around the bobbin; and
a superconducting wire joint, further comprising:
a billet comprising a cavity;
a plug configured to partially fill the billet cavity; and
the first wire and a second wire comprising a reacted $MgB_2$ monofilament, each of the first and second wire further comprising an end of the monofilament sheared at an acute angle,
wherein the first wire end and the second wire end are disposed within the billet cavity, the first wire and second wire extending outward from the billet cavity via a gap between the billet and the plug, and the billet cavity is filled with a pressurized ceramic powder.

12. The superconducting magnet of claim 11, further comprising a persistent current switch.

13. The superconducting magnet of claim 11, wherein the superconducting magnet is configured to operate above the temperature of liquid helium.

14. The superconducting magnet of claim 11, wherein the superconducting magnet is configured to operate above 10 K.

15. The superconducting magnet of claim 11, further comprising a joint box containing the superconducting wire joint.

16. The superconducting magnet of claim 15, further comprising a furnace configured to maintain superconducting wire joint within the joint box at a preconfigured temperature.

17. A method for making a superconducting magnet, comprising:
forming a coil from windings of a first wire comprising a reacted $MgB_2$ monofilament;
filling a cavity of a stainless steel billet having a single cavity opening with a ceramic powder comprising Mg+B;
for each of the first wire and a second wire comprising a reacted $MgB_2$ monofiliment:
shearing an end of the monofilament at an acute angle; and
inserting the wire into the billet cavity;
inserting a copper plug configured to partially fill the billet cavity into the billet cavity; and
forming a partial seal of a portion of the billet cavity adjacent to the plug and the wires with a ceramic paste,
wherein the first wire end monofiliment and the second wire end monofiliment are disposed within the billet cavity, the first wire and second wire extending outward from the single billet cavity opening via a gap of the partial seal between the billet and the plug.

* * * * *